(12) United States Patent
Dong et al.

(10) Patent No.: US 9,443,770 B2
(45) Date of Patent: Sep. 13, 2016

(54) PATTERNING PROCESS FOR FIN IMPLANTATION

(71) Applicant: International Business Machines Corporation, Armonk, NY (US)

(72) Inventors: Huihang Dong, Danbury, CT (US); Wai-Kin Li, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 21 days.

(21) Appl. No.: 14/282,491

(22) Filed: May 20, 2014

(65) Prior Publication Data

US 2015/0340292 A1 Nov. 26, 2015

(51) Int. Cl.
*H01L 21/336* (2006.01)
*H01L 21/8238* (2006.01)
*H01L 21/265* (2006.01)
*H01L 21/84* (2006.01)

(52) U.S. Cl.
CPC . *H01L 21/823821* (2013.01); *H01L 21/26586* (2013.01); *H01L 21/823814* (2013.01); *H01L 21/845* (2013.01); *H01L 21/26513* (2013.01)

(58) Field of Classification Search
CPC .............. H01L 21/823821; H01L 21/26586
USPC .............. 438/229, 230, 231, 302, 303; 257/E21.409
See application file for complete search history.

(56) References Cited

U.S. PATENT DOCUMENTS

| | | | |
|---|---|---|---|
| 8,232,162 B2 | 7/2012 | Booth, Jr. et al. | |
| 8,507,337 B2 | 8/2013 | Loo et al. | |
| 9,117,842 B2* | 8/2015 | Wei | H01L 21/823821 |
| 2010/0167472 A1 | 7/2010 | Gu et al. | |
| 2011/0269287 A1 | 11/2011 | Tsai et al. | |
| 2012/0315736 A1 | 12/2012 | Iwamoto et al. | |
| 2013/0043474 A1* | 2/2013 | Tang | H01L 27/1288 257/59 |
| 2014/0001520 A1* | 1/2014 | Glass | H01L 29/66439 257/288 |

OTHER PUBLICATIONS

Vandeweyer, et al., "New lithographic requirements for the implant levels in scaled devices", Microelectric Engineering, Aug. 2011, pp. 2171-2173, 88, Elsevier B.V.
Veloso, et al., "Multi-Gate Fin Field-Effect Transistors Junctions Optimization by Conventional Ion Implantation for (Sub-)22 nm Technology Nodes Circuit Applications", Japanese Journal of Applied Physics, Apr. 2011, 50.

* cited by examiner

*Primary Examiner* — Robert Huber
(74) *Attorney, Agent, or Firm* — Scully, Scott, Murphy & Presser, P.C.; Steven J. Meyers (57) ABSTRACT

After forming an organic planarization layer (OPL) atop a substrate which includes a plurality of semiconductor fins and a gate structure thereon, the OPL is recessed such that uppermost surfaces of remaining portions of the OPL are located below an uppermost surface of the gate structure but above top surfaces of the semiconductor fins. The remaining portions of the OPL are patterned to expose semiconductor fins in a pFinFET region for subsequent ion implantation. Portions of the OPL that remain on the semiconductor fins in an nFinFET region act as an implantation mask to shield the semiconductor fins in the nFinFET region from the ion implantation.

17 Claims, 9 Drawing Sheets

PATTERNING PROCESS FOR FIN IMPLANTATION

BACKGROUND

The present disclosure relates to semiconductor device fabrication, and more particularly to methods of reducing resist shadowing during ion implantation in forming source/drain regions in fin field effect transistors (FinFETs) for complementary metal oxide semiconductor (CMOS) integration.

FinFETs are one of the leading candidates to replace classical planar metal-oxide-semiconductor field effect transistors (MOSFETs) for future CMOS technologies due to the multiple-gate configuration of the fin device leading to an intrinsically superior short channel effect (SCE) control. Conventionally, source/drain regions in FinFETs are formed by implanting dopants into fins and during the ion implantation, one of the devices types, e.g., n-type FinFETs (nFinFETs), must be covered or masked with a layer of material, such as photoresist, so dopants are implanted only into another device type, e.g., p-type FinFETs (pFinFETs). Scaling of FinFETs creates new challenges for source/drain formation for CMOS integration. After forming the resist layer over the gate, the high topography of the resist layer prevents ions from being implanted into fins close to boundaries of pFinFETs and nFinFETs. This is known as resist shadowing. Therefore, there remains a need to reduce the resist shadowing during ion implantation in forming source/drain regions in FinFETs for CMOS integration.

SUMMARY

The present disclosure provides a method to reduce resist shadowing during ion implantation in forming source/drain regions in FinFETs for CMOS integration. After forming an organic planarization layer (OPL) atop a substrate which includes a plurality of semiconductor fins and a gate structure thereon, the OPL is recessed such that uppermost surfaces of remaining portions of the OPL are located below an uppermost surface of the gate structure but above top surfaces of the semiconductor fins. The remaining portions of the OPL are patterned to expose semiconductor fins in a pFinFET region for subsequent ion implantation. Portions of the OPL that remain on the semiconductor fins in an nFinFET region act as an implantation mask to shield the semiconductor fins in the nFinFET region from the ion implantation.

In one aspect of the present disclosure, a method of forming a semiconductor structure is provided.

In one embodiment, the method includes forming a plurality of semiconductor fins on a substrate. A gate structure is then formed over a portion of each semiconductor fin. After forming an OPL over the substrate to cover the plurality of semiconductor fins and the gate structure, the OPL is recessed to expose a portion of the gate structure. The remaining portions of the OPL on opposite sides of the gate structure have uppermost surfaces located above top surfaces of the plurality of semiconductor fins. Next, the remaining portions of the OPL are patterned to expose portions of a first set of the plurality of semiconductor fins that are not covered by the gate structure and to leave a second set of the plurality of semiconductor fins covered. A first type dopant is then implanted into portions of the exposed portions of the first set of the plurality of semiconductor fins on opposite sides of the gate structure to form source and drain regions in the first set of the plurality of semiconductor fins.

In another embodiment, the method includes forming a plurality of semiconductor fins on a substrate. A gate structure is then formed over a portion of each semiconductor fin. After forming a first OPL over the substrate to cover the plurality of semiconductor fins and the gate structure, the first OPL is recessed to expose a portion of the gate structure. The remaining portions of the first OPL on opposite sides of the gate structure have uppermost surfaces located above top surfaces of the plurality of semiconductor fins. Next, a second OPL is formed over the remaining portions of the first OPL and the gate structure followed by forming a hard mask layer over the second OPL. A stack of the hard mask layer, the second OPL and the remaining portions of the first OPL is then patterned to expose portions of a first set of the plurality of semiconductor fins that are not covered by the gate structure and to leave a second set of the plurality of semiconductor fins covered. After removing remaining portions of the hard mask layer and remaining portions of the second OPL, a first type dopant is implanted into portions of the exposed portions of the first set of the plurality of semiconductor fins on opposite sides of the gate structure to form source and drain regions in the first set of the plurality of semiconductor fins.

DETAILED DESCRIPTION

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

Figure 1A:
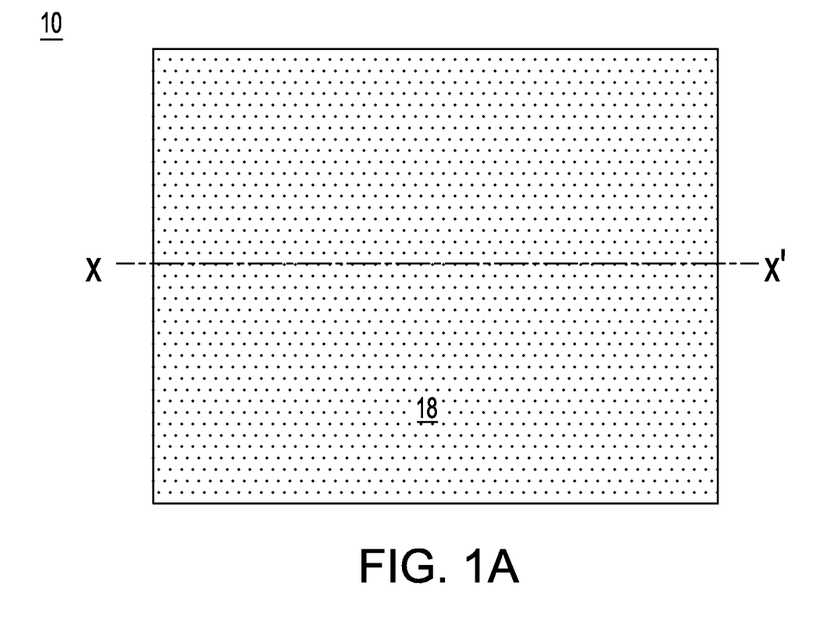
FIG. 1A is a top-down view of an initial structure including a semiconductor substrate that can be employed in embodiments of the present disclosure.
Figure 1B:
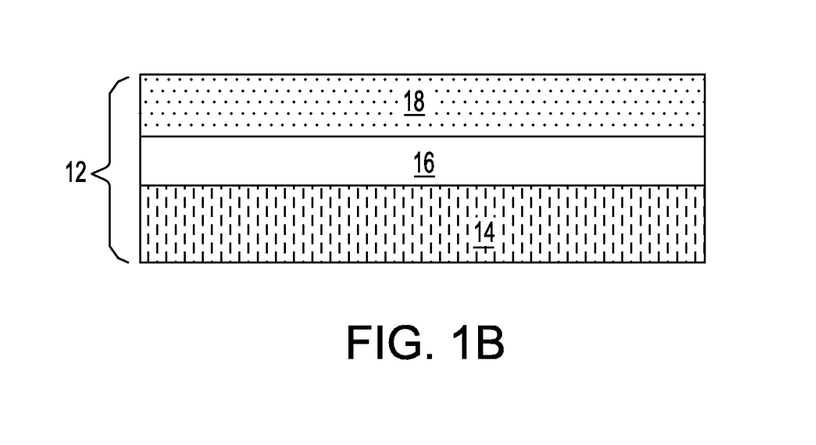
FIG. 1B is a cross-sectional view of the initial structure of FIG. 1A along line x-x'.

Referring to FIGS. 1A-1B, there are illustrated an initial structure that can be employed in embodiments of the present disclosure. Specifically, the initial structure 10 includes a semiconductor substrate 12. In one embodiment, and as shown in the drawings, the semiconductor substrate 12 is a semiconductor-on-insulator (SOI) substrate. In another embodiment (not shown), the semiconductor substrate 12 is a bulk semiconductor material.

When a SOI substrate is employed, the SOI substrate includes a handle substrate 14, a buried insulator layer 16 located on an upper surface of the handle substrate 14, and a semiconductor layer 18 located on an upper surface of the buried insulator layer 16.

In some embodiments, the handle substrate 14 and the semiconductor layer 18 may comprise the same, or different, semiconductor material. The term "semiconductor" as used herein in connection with the semiconductor material of the handle substrate 14 and the semiconductor layer 18 denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate 14 and the semiconductor layer 18. In one embodiment, the handle substrate 14 and the semiconductor layer 18 are both comprised of Si. In another embodiment, hybrid SOI substrates are employed which have different surface regions of different crystallographic orientations.

The handle substrate 14 and the semiconductor layer 18 may have the same or different crystal orientation. For example, the crystal orientation of the handle substrate 14 and/or the semiconductor layer 18 may be {100}, {110}, or {111}. Other crystallographic orientations besides those specifically mentioned can also be used in the present disclosure. The handle substrate 14 and/or the semiconductor layer 18 of the SOI substrate may be a single crystalline semiconductor material, a polycrystalline material, or an amorphous material. Typically, at least the semiconductor layer 18 is a single crystalline semiconductor material.

In some embodiments, the handle substrate 14 is a non-semiconductor material including, for example, a dielectric material and/or a conductive material. In other embodiments of the present disclosure, the handle substrate 14 is optional and the initial structure that is employed includes only the buried insulator layer 16 and the semiconductor layer 18.

The buried insulator layer 16 of the SOI substrate may be a crystalline or non-crystalline oxide or nitride. In one embodiment, the buried insulator layer 16 is an oxide. The buried insulator layer 16 may be continuous, as shown, or it may be discontinuous. When a discontinuous buried insulating region is present, the insulating region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer 18 to a layer having a thickness that is more desirable.

The thickness of the semiconductor layer 18 of the SOI substrate can be from 10 nm to 100 nm, with a thickness from 20 nm to 70 nm being more typical. If the thickness of the semiconductor layer 18 is not within the above mentioned range, a thinning step such as, for example, planarization or etching can be used to reduce the thickness of the semiconductor layer 18 to a value within the range mentioned above.

The thickness of the buried insulator layer 16 of the SOI substrate can be from 1 nm to 200 nm, with a thickness from 100 nm to 150 nm being more typical.

The thickness of the handle substrate 14 of the SOI substrate can be from 400 µm to 1,000 µm, with a thickness from 50 µm to 900 µm being more typical.

In some embodiments of the present disclosure, a hard mask layer (not shown) can be formed on an uppermost surface of the semiconductor substrate 12 prior to forming semiconductor fins. During the subsequent formation of the semiconductor fins, a portion of the hard mask layer provides a fin cap on a top surface of each semiconductor fin. In such a structure, the gate dielectric material portion to be subsequently formed is present only along the vertical sidewalls of each semiconductor fin. In the embodiment that is illustrated, no fin cap is present, and, as such, the gate dielectric material portion is present along the vertical sidewalls and on a top surface of each semiconductor fin.

When employed, the hard mask layer may comprise an oxide, nitride, oxynitride or any combination thereof including multilayers. In one embodiment, the hard mask layer includes silicon oxide or silicon nitride. The hard mask layer can be formed utilizing a conventional deposition process such as, for example, chemical vapor deposition (CVD), plasma enhanced chemical vapor deposition (PECVD), chemical solution deposition, evaporation or other like deposition processes. Alternatively, the hard mask layer can be formed by a thermal process such as, for example, oxidation or nitridation. Any combination of the above mentioned processes can also be used in forming the hard mask layer. The hard mask layer that is formed can have a thickness from 20 nm to 80 nm, with a thickness from 30 nm to 60 nm being more typical.

Figure 2A:
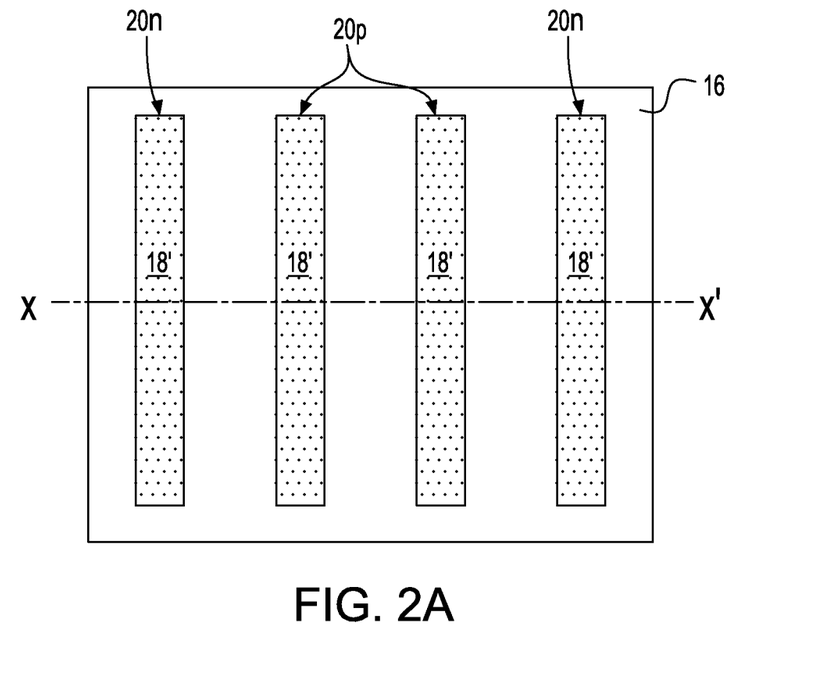
FIG. 2A is a top-down view of the structure of FIG. 1A after forming a plurality of semiconductor fins.
Figure 2B:
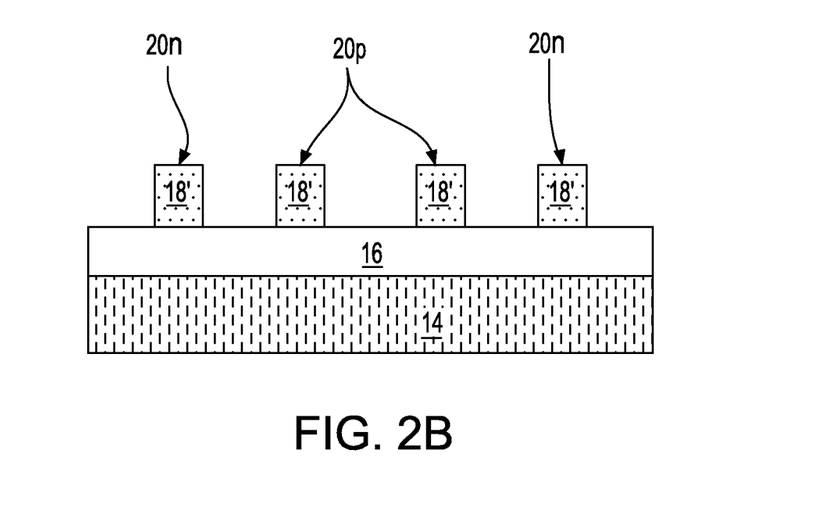
FIG. 2B is a cross-sectional view of the structure of FIG. 2A along line x-x'.

Referring now to FIGS. 2A-2B, there are illustrated the structure of FIGS. 1A-1B after forming a plurality of semiconductor fins 20n, 20p. In the drawings and by way of illustration, the semiconductor fins designated as 20n are used for nFinFET devices, while the semiconductor fins designated as 20p are used for pFinFET devices. Each semiconductor fin 20n, 20p includes a remaining non-etched portion of semiconductor layer 18 which is designated as 18' herein.

In one embodiment, each of the semiconductor fins 20n, 20p can be formed by lithography and etching. The lithographic step includes applying a photoresist layer (not shown) atop the semiconductor layer 18 or the hard mask if present, exposing the photoresist layer to a desired pattern of radiation, and developing the exposed photoresist layer utilizing a conventional resist developer. The etching process comprises dry etching and/or wet chemical etching. Illustrative examples of suitable dry etching processes that can be used in the present disclosure include reactive ion etching (RIE), ion beam etching, plasma etching or laser ablation. Typically, a RIE process or an ion beam etching process is used. The etching process transfers the pattern from the patterned photoresist layer to the semiconductor layer 18 or first to the hard mask layer if present and thereafter to underlying semiconductor layer 18 utilizing the buried insulator layer 16 as an etch stop. After transferring the pattern into the semiconductor layer 18, the patterned photoresist layer can be removed utilizing a conventional resist stripping process such as, for example, ashing. Alternatively, the semiconductor fins 20n, 20p can also be formed utilizing a sidewall image transfer (SIT) process. In a typical SIT process, a spacer is formed on a dummy mandrel. The dummy mandrel is removed and the remaining spacers are used as a hard mask to etch the semiconductor fins. The spacers are then removed after the semiconductor fins have been formed.

Each of the semiconductor fins 20n, 20p that is formed may have a height ranging from 5 nm to 200 nm, with a height ranging from 10 nm to 100 nm being more typical, and a width ranging from 4 nm to 50 nm, with a width ranging from 5 nm to 20 nm being more typical. Adjacent semiconductor fins 20n, 20p may be separated by a pitch ranging from 20 nm to 100 nm, with a pitch ranging from 30 nm to 50 nm being more typical.

In some embodiments of the present disclosure and when the hard mask layer is present, the hard mask layer that remains atop the semiconductor fins 20n, 20p can be removed at this stage. The removal of the remaining non-etched portion of hard mask layer can be achieved by performing a selective etching process or by utilizing a planarization process such as chemical mechanical planarization.

Figure 3A:
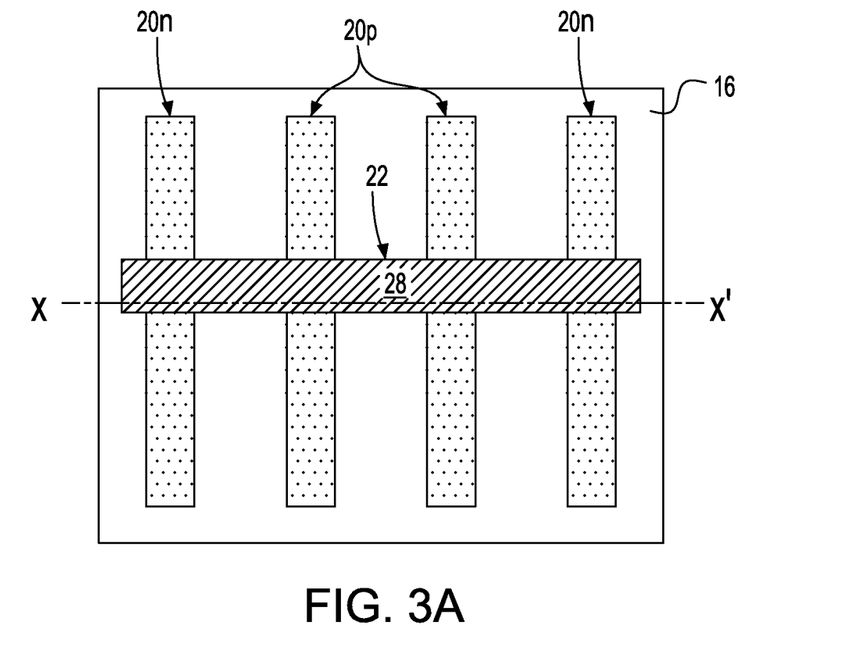
FIG. 3A is a top-down view of the structure of FIG. 2A after forming a gate structure that is oriented perpendicular to and straddles a portion of each semiconductor fin.
Figure 3B:
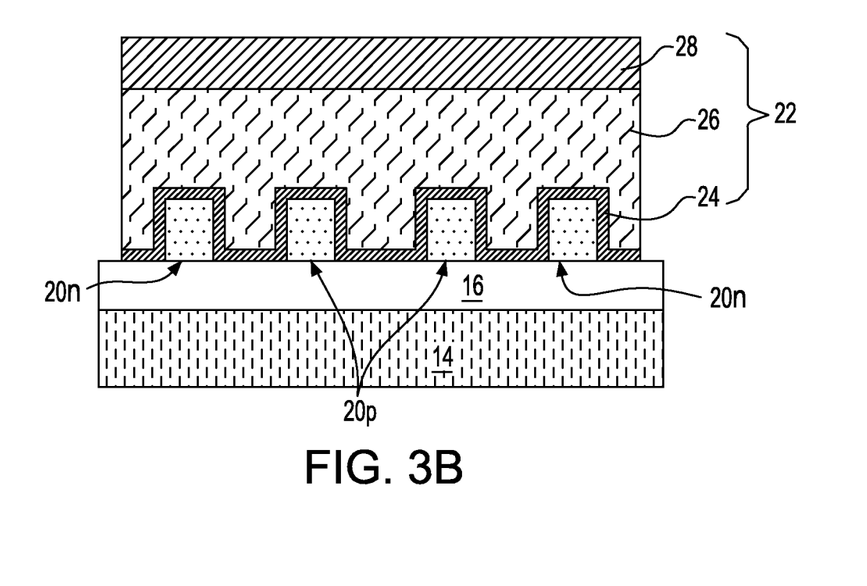
FIG. 3B is a cross-sectional view of the structure of FIG. 3A along line x-x'.

Referring now to FIG. 3A-3B, there are illustrated the structure of FIGS. 2A-2B after formation of a gate structure 22 that is oriented perpendicular to and straddles a portion of each semiconductor fin 20n, 20p. Although only one gate structure is described and illustrated, the present disclosure is not limited to such a number of gate structures. Instead, a plurality of gate structures can be formed upon the semiconductor fins 20n, 20p.

The gate structure 22 includes a gate dielectric 24 located on a top surface and sidewalls of each semiconductor fin 20n, 20p, an overlying gate conductor 26 and a dielectric cap 28 located on the gate conductor 26. In some embodiments, the dielectric cap 28 can be omitted. The gate structure 22 can be formed by first providing a material stack of a gate dielectric layer, a gate conductor layer and a dielectric cap layer (not shown). The material stack can then be patterned by lithography and etching to provide the gate structure 22. The lithographic and etching processes employed in patterning the material stack can be the same as those mentioned above for patterning the semiconductor fins 20n, 20p.

The gate dielectric layer that provides the gate dielectric 24 of the gate structure 22 can include an oxide, nitride or oxynitride. In one example, the gate dielectric layer can include a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed.

The gate dielectric layer can be formed by any deposition technique including, for example, chemical vapor deposition (CVD), plasma enhanced chemical vapor deposition (PECVD), physical vapor deposition (PVD), atomic layer deposition (ALD) or sputtering. Alternatively, the gate dielectric layer can also be formed by a thermal growth process such as, for example, oxidation, nitridation or oxynitridation to convert surface portions of the semiconductor fins 20n, 20p into a dielectric material. The gate dielectric layer that is formed can have a thickness ranging from 0.5 nm to 10 nm, with a thickness from 0.5 nm to about 3 nm being more typical.

The gate conductor layer that provides the gate conductor 26 of the gate structure 22 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor material for semiconductor fins 20n is different from the gate conductor material for semiconductor fins 20p. Different gate conductor materials can be formed by utilizing block mask technology.

The gate conductor layer can be formed utilizing a deposition process including, for example, CVD, PECVD, PVD, ALD, sputtering, or other like deposition processes. In embodiments in which polysilicon or SiGe are used as the gate conductor material, an in-situ deposition process can be used or alternatively deposition followed by ion implantation can be used. The gate conductor layer that is formed can have a thickness ranging from 50 nm to 200 nm, although lesser or greater thicknesses can also be employed.

The dielectric cap layer used in providing the dielectric cap 28 of the gate structure 22 can be comprised of a dielectric oxide, nitride or oxynitride. In one embodiment of the present disclosure, the dielectric cap layer includes silicon nitride. The dielectric cap layer can be formed by a deposition process including, for example, CVD, PECVD, PVD, ALD or sputtering. The dielectric cap layer that is formed can have a thickness ranging from 25 nm to 100 nm, although lesser or greater thicknesses can also be employed.

In some embodiments of the present disclosure, the gate structure 22 can be a sacrificial gate structure (not shown). The term "sacrificial gate structure' as used herein denotes a material that serves as a placeholder structure for a functional gate structure to be subsequently formed. The term "functional gate structure" as used herein denotes a permanent gate structure used to control output current (i.e., flow of carriers in the channel) of a semiconducting device through electrical fields. The sacrificial gate structure can be formed by first providing a blanket layer of a sacrificial gate material. The blanket layer of sacrificial gate material can be formed, for example, by CVD or PECVD. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structure. The sacrificial gate structure can be replaced with a function gate structure after forming a source region and a drain region (collectively referred to hereinafter as "source/drain regions") utilizing ion implantation.

Figure 4A:
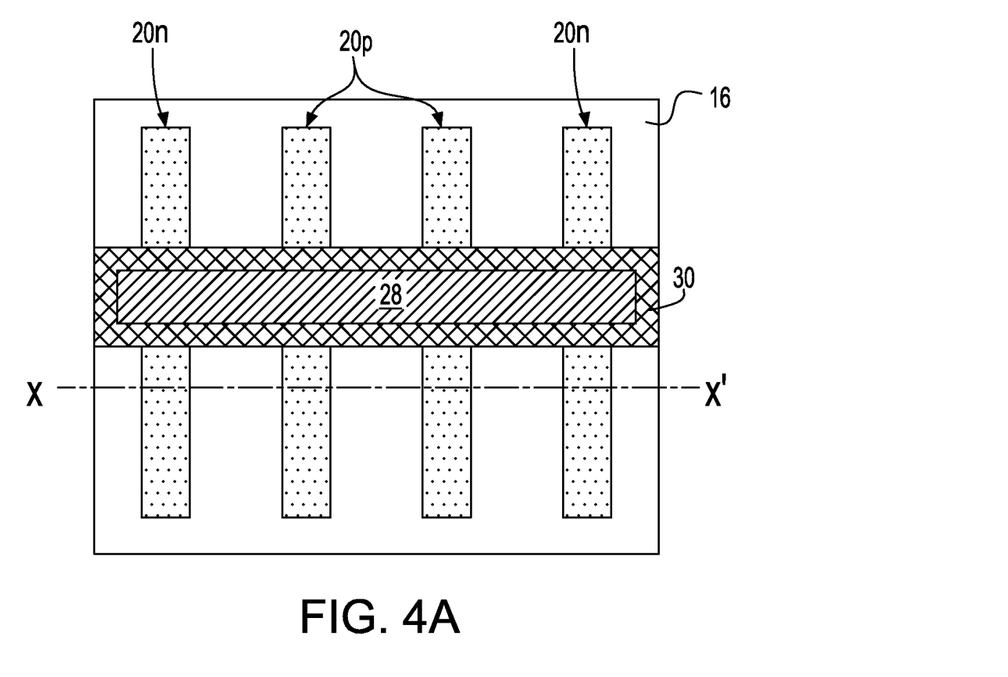
FIG. 4A is a top-down view of the structure of FIG. 3A after forming a dielectric spacer on each sidewall of the gate structure.
Figure 4B:
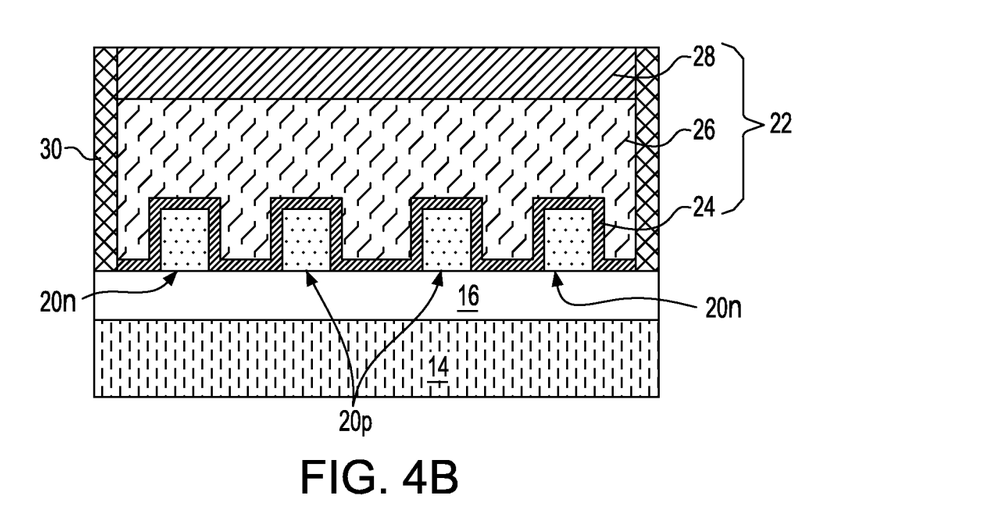
FIG. 4B is a cross-sectional view of the structure of FIG. 4A along line x-x'.

Referring now to FIG. 4A-4B, there are illustrated the structure of FIGS. 3A-3B after forming a dielectric spacer 30 on each sidewall of the gate structure 22. Each dielectric spacer 30 has a base, i.e., bottommost surface, which is in direct physical contact with a portion of a top surface of the buried insulator layer 16 and each semiconductor fin 20$n$, 20$p$. In some embodiments, and as shown, each dielectric spacer 30 has a topmost surface that is coplanar with an upper surface of the dielectric cap 28. When no dielectric cap is present, each dielectric spacer 30 can have a topmost surface that is coplanar with an upper surface of the gate conductor 26.

The dielectric spacer 30 can be formed by first depositing a spacer material layer on exposed surfaces of the gate structure 22 and the semiconductor fins 20$n$, 20$p$. The spacer material layer can be formed utilizing any conventional deposition process including, for example, CVD, PECVD, ALD, evaporation or chemical solution deposition. Alternatively, a thermal growth process including oxidation and/or nitridation can be employed in forming the spacer material layer. Following the formation of the spacer material layer, the spacer material layer is etched to form the dielectric spacer 30 shown in FIGS. 4A-4B. The etching of the spacer material layer may be performed utilizing any dry etching process such as, for example, RIE.

The dielectric spacer 30 includes a dielectric material such as, for example, an oxide, a nitride or an oxynitride. In one embodiment, each dielectric spacer 30 is composed of silicon nitride.

Figure 5A:
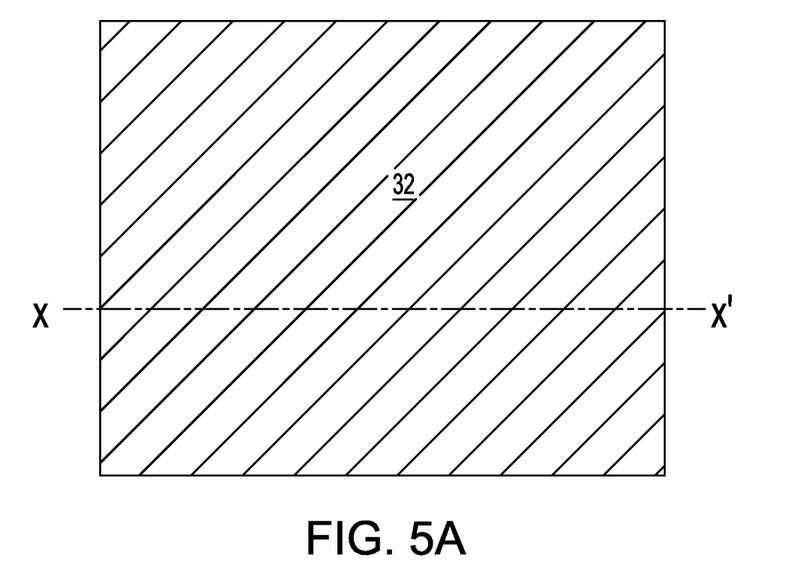
FIG. 5A is a top-down view of the structure of FIG. 4A after forming an organic planarization layer (OPL) over the substrate to cover the gate structure and the semiconductor fins.
Figure 5B:
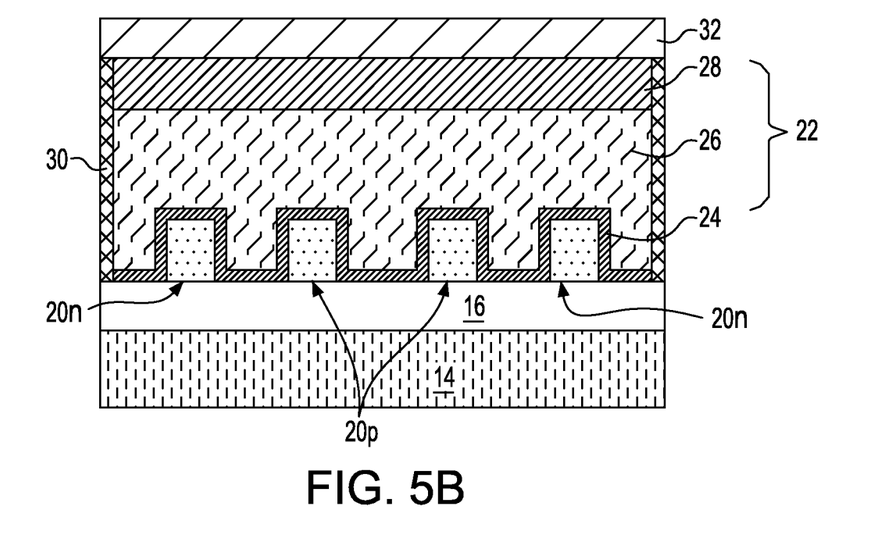
FIG. 5B is a cross-sectional view of the structure of FIG. 5A along line x-x'.

Referring now to FIG. 5A-5B, there are illustrated the structure of FIGS. 4A-4B after forming an organic planarization layer (OPL) 32 over the substrate, i.e., the buried insulator layer 16 and the handle substrate 14, to cover the gate structure 22 and each semiconductor fin 20$n$, 20$p$. The OPL layer 32 that can be employed in the present disclosure includes a self-planarizing organic planarization material, which can be a polymer layer with sufficiently low viscosity so that an upper surface of the OPL 32 is a planar horizontal surface. Exemplary organic planarization materials that can be employed in the present disclosure include, but are not limited to, polyacrylate resin, epoxy resin, phenol resin, polyamide resin, polyimide resin, unsaturated polyester resin, polyphenylenether resin, polyphenylene sulfide resin, and benzocyclobutene (BCB). The OPL 32 can be formed by using spin coating, spray, CVD or evaporation. The thickness of the OPL 32 can vary so long as the upper surface of the OPL 32 is formed above the gate structure 22.

Figure 6A:
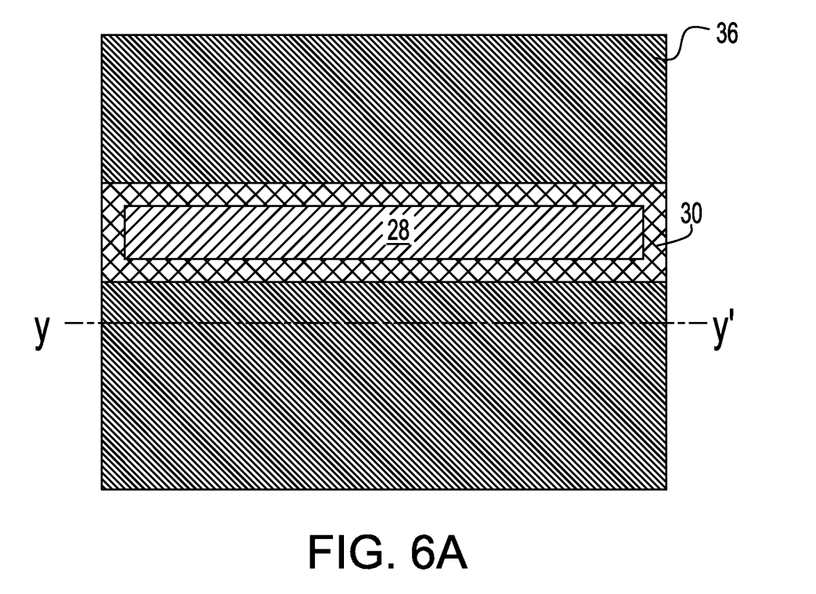
FIG. 6A is a top-down view of the structure of FIG. 5A after recessing the OPL to form an OPL portion on each side of the gate structure.
Figure 6B:
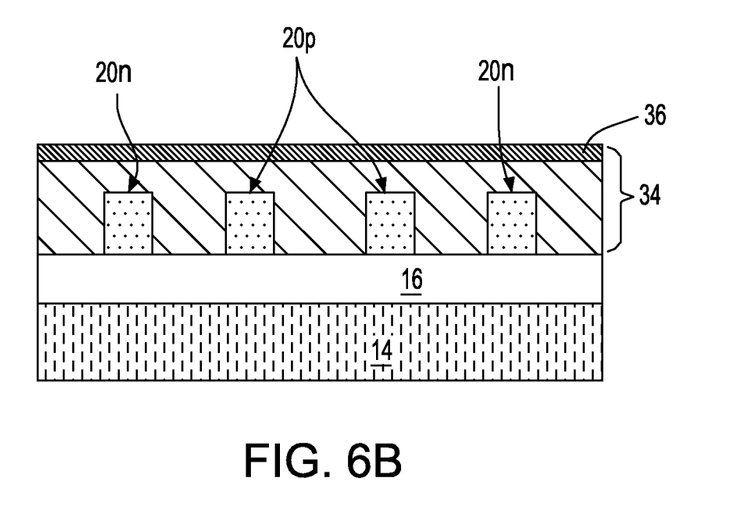
FIG. 6B is a cross-sectional view of the structure of FIG. 6A along line y-y'.

Referring now to FIGS. 6A-6B, there are illustrate the structure of FIGS. 5A-5B after recessing the OPL 32 to form an OPL portion 34 on each side of the gate structure 22. An etch back process, such as, for example, RIE, can be performed to recess the OPL 32 to provide OPL portions 34. The etch back process removes an upper portion of the OPL 32 selectively to the gate structure 22 and the dielectric spacer 30. A portion of the gate structure 22 is thus exposed. The etch back process also modifies recessed surface portions of the OPL portions 34 to produce a surface cap 36 at an upper portion of each OPL portion 34. In one embodiment, when the reactive ion etching of the OPL 32 is performed using a gas mixture containing $C_xF_y$, $C_xF_y$-containing surface caps 36 can be formed. The surface caps 36 may have a thickness ranging from 2 nm to 20 nm. The recessing depth is controlled such that the OPL portions 34 have a height great enough to prevent dopants from entering into the semiconductor fins 20$n$ in the nFinFET region but will not shadow the semiconductor fins 20$p$ in the pFinFET region during a subsequent ion implantation. As a result, an effective access of the implanted dopants to the semiconductor fins 20$p$ in the pFinFET region can be realized. In some embodiments of the present disclosure, uppermost surfaces of the OPL portions 34 can be 40 nm to 60 nm above the top surfaces of semiconductor fins 20$n$, 20$p$.

Figure 7A:
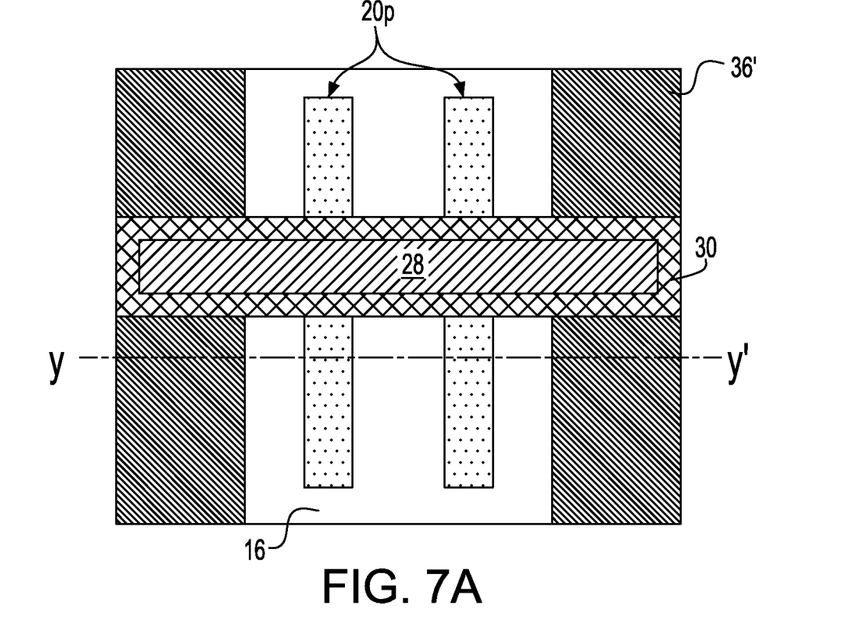
FIG. 7A is a top-down view of a first exemplary semiconductor structure that can be derived from the structure of FIG. 6A after forming an opening in the OPL portions to expose portions of the semiconductor fins in a pFinFET region for ion implantation.
Figure 7B:
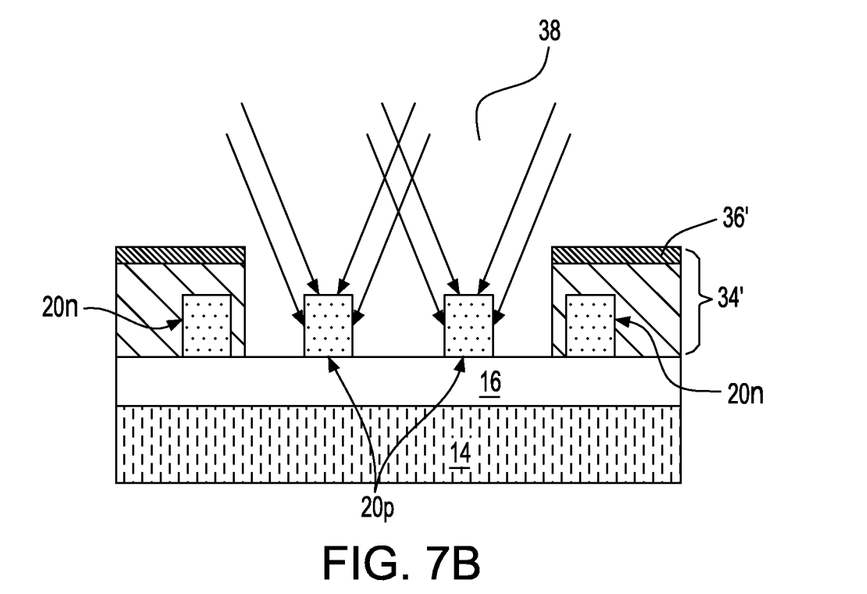
FIG. 7B is a cross-sectional view of the first exemplary semiconductor structure of FIG. 7A along line y-y'.

Referring now to FIGS. 7A-7B, there are illustrated a first exemplary semiconductor structure that can be derived from the structure of FIG. 6A-6B after forming an opening 38 in the OPL portions 34 to expose portions of semiconductor fins 20$p$ in the pFinFET region for ion implantation.

The openings 38 can be formed by lithography and etching. A photoresist layer (not shown) is first applied onto the substrate (i.e., buried insulator layer 16 and handle substrate 14) by spinning coating to cover the OPL portions 34, the gate structure 22 and the dielectric spacer 30. The photoresist layer is patterned by lithographic exposure and development. The resulting pattern in the photoresist layer is then transferred into the underlying OPL portions 34 using the buried insulator layer 16 as an etch stop. The etch can be performed, for example, by an anisotropic etch such as RIE. The opening 38 exposes portions of semiconductor fins 20$p$ in the pFinFET region that are not covered by the gate structure 22 or the dielectric spacer 30, while the semiconductor fins 20$n$ in the nFinFET region are covered by remaining portions of the OPL portion 34 for further processing. The remaining portions of OPL portions 34 are herein referred to as patterned OPL portions 34'. The remaining portions of surface caps 36 are herein referred to as patterned surface caps 36'. After transferring pattern into the OPL portions 34, the patterned photoresist layer can be removed by utilizing a stripping process, such as, for example, ashing.

An angled ion implantation process is next performed through the opening 38 to supply p-type dopants to portions of the exposed portions of the semiconductor fins 20$p$ in the pFinFET region adjacent to the gate structure 22 so as to form source/drain regions in the semiconductor fins 20$p$ on opposite sides of the gate structure 22. In one embodiment, the implant is performed at an angle from 15° to 50° relative to the topmost surface of the substrate (i.e., buried insulator layer 16 and handle substrate 14). The semiconductor fins 20$n$ in the nFinFET region are protected from this ion implantation process using the patterned OPL portions 34' as an ion implantation mask. For a pFinFET, the semiconductor fins 20p may be implanted with boron (B), indium (In), or gallium (B). For clarity, the source/drain regions are not however shown in the drawings of the present disclosure.

After ion implantation, the patterned OPL portions 34' are removed. In one embodiment, dry etching or chemical wet etching can be employed to remove the patterned OPL portions 34'. In one embodiment, the patterned OPL portions 34' can be removed by sulfuric acid. Subsequently, the dopants in the source/drain regions can be activated by an anneal, such as repaid thermal anneal.

Source/drain regions can be formed in the semiconductor fins 20n in the nFinFET region by repeating the processes as described above for forming source/drain regions in the semiconductor fins 20p in the pFinFET region. For an nFinFET, the semiconductor fins 20n may be implanted with arsenic (As) or phosphorus (P).

While the above figures illustrate the formation of source/drain regions in a pFinFET region before the formation of source/drain regions in an nFinFET region, it will be appreciated that the formation of source/drain regions in an nFinFET region before the formation of source/drain regions in a pFinFET region also is contemplated here.

Figure 8A:
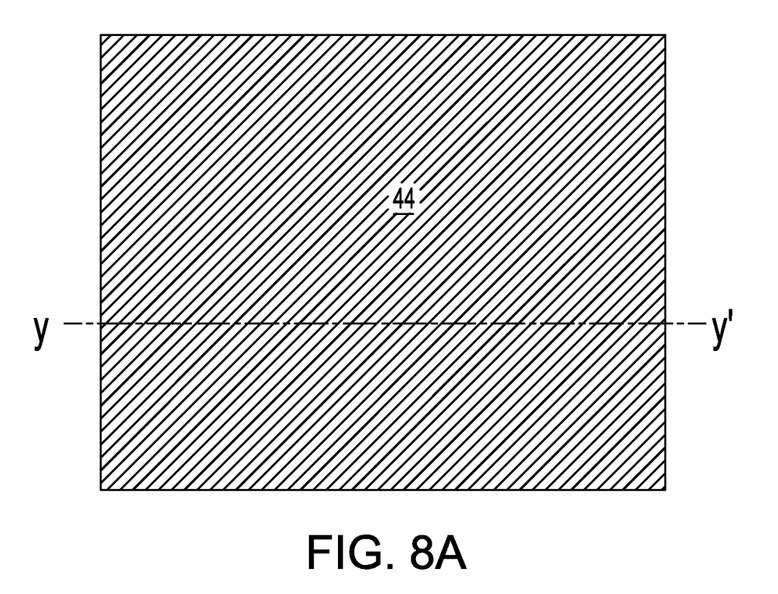
FIG. 8A is a top-down view of a second exemplary semiconductor structure that can be derived from the structure of FIG. 6A after forming a second OPL and a hard mask layer sequentially over an entire structure of FIG. 6A.
Figure 8B:
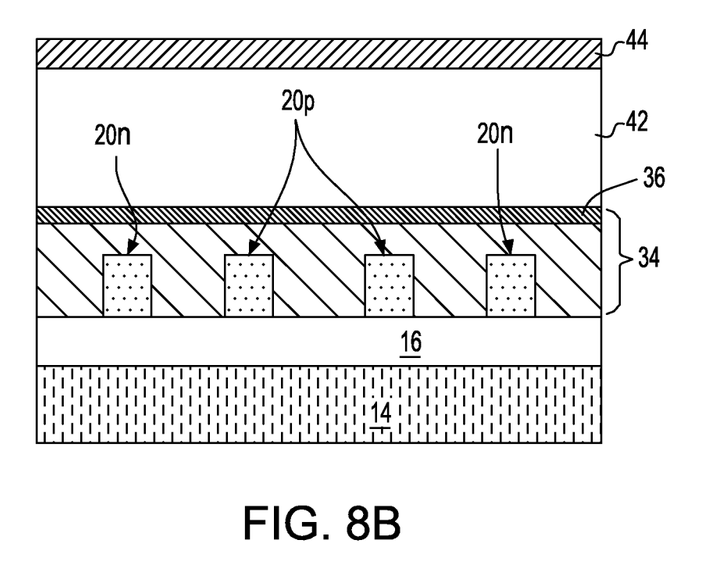
FIG. 8B is a cross-sectional view of the second exemplary semiconductor structure of FIG. 8A along line y-y'.

Referring now to FIGS. 8A-8B, there are illustrated a second exemplary semiconductor structure that can be derived from the structure of FIGS. 6A-6B after forming a second OPL 42 and a hard mask layer 44 sequentially over an entire structure of FIGS. 6A-6B. Forming a second OPL 42 and a hard mask layer 44 over the OPL portions 34 would allow better control over the critical dimension during the subsequent lithographic patterning.

The second OPL 42 can be formed over the OPL portions 34, the gate structure 22 and the gate spacer 30 by, for example, spin coating. The surface caps 36 prevent intermixing of the second OPL 42 and the OPL portions 34 during the spin coating. The second OPL 42 can include an organic planarization material that can be selectively removed with respect to the material of the OPL 32. Exemplary organic planarization materials that can be employed in the second OPL 42 include, but are not limited to, alcohol-based polymers. The thickness of the second OPL 42 can vary so long as it covers the gate structure 22 and the gate spacer 30 completely.

The hard mask layer 44 can then be formed on an upper surface of the second OPL 42. The hard mask layer 44 can include silicon oxide, silicon nitride, amorphous carbon or a silicon-containing antireflective coating (SiARC) material. In one embodiment, the hard mask layer 44 is SiARC. The hard mask layer 44 can be applied using spin coating or a vapor deposition process such as, for example, CVD, PECVD or ALD.

Figure 9A:
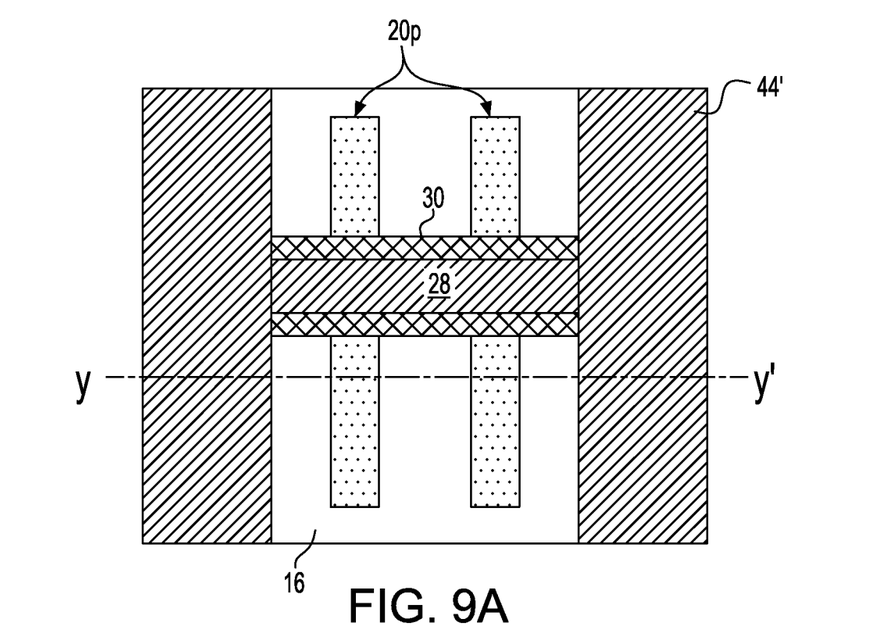
FIG. 9A is a top-down view of the second exemplary semiconductor structure of FIG. 8A after forming an opening through the hard mask layer, the second OPL layer and the OPL portions to expose portions of the semiconductor fins in a pFinFET region for ion implantation.
Figure 9B:
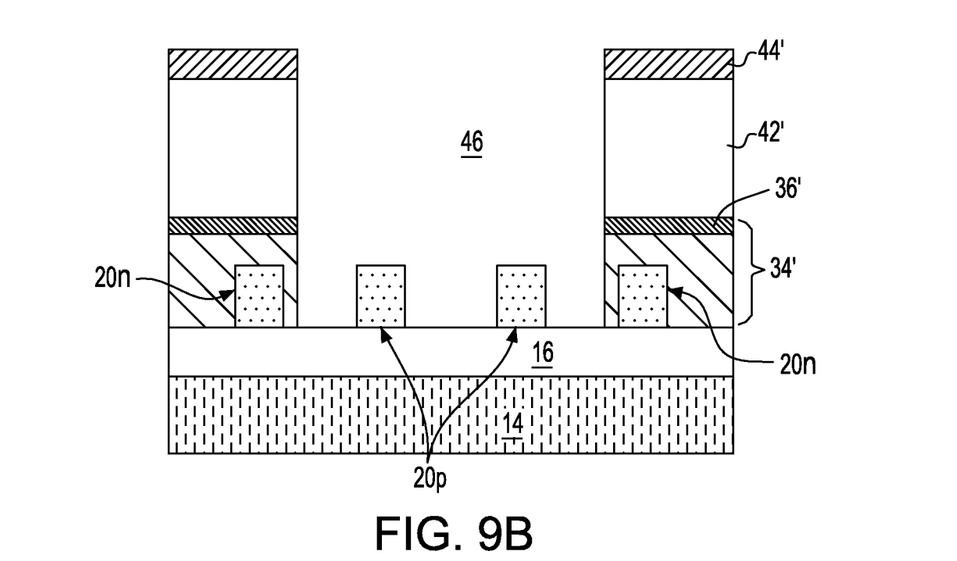
FIG. 9B is a cross-sectional view of the second exemplary semiconductor structure of FIG. 9A along line y-y'.

Referring now to FIGS. 9A-9B, there are illustrated the second exemplary semiconductor structure of FIGS. 8A-8B after forming an opening 46 through the hard mask layer 44, the second OPL 42 and the OPL portions 34 to expose portions of the semiconductor fins 20p in the pFinFET region for ion implantation.

The opening 46 can be formed by lithography and etching. A photoresist layer (not shown) is first applied atop the hard mask layer 44. The photoresist layer is patterned by lithographic exposure and development. The pattern formed in the photoresist layer is then transferred into underlying hard mask layer 44, the second OPL 42 and the OPL portions 34 by at least one etch using the buried insulator layer 16 as an etch stop. The etch can be an anisotropic etch such as RIE. The opening 46 exposes portions of the semiconductor fins 20p in the pFinFET region that are not covered by the gate structure 22 or the dielectric spacer 30. Remaining portions of the second OPL 42 are herein referred to as patterned second OPL portions 42', while remaining portions of the hard mask layer 44 are herein referred to as patterned hard mask layer portions 44'.

The patterned photoresist layer portions are then removed by utilizing a stripping process, such as, for example, ashing. After removing the patterned photoresist layer portions, the patterned hard mask layer portions 44' and the patterned second OPL portions 42' are also removed. The patterned hard mask layer portions 44' can be removed by a chemical wet etching selective to the patterned second OPL portions 42'. In one embodiment, the patterned hard mask layer portions 44' are removed by an acidic solution, such as, for example, buffered hydrofluoric acid (BHF), dilute hydrofluoric acid (DHF) or acetic acid. The patterned second OPL portions 42' can be removed by a chemical wet etching selective to the patterned OPL portions 34'. In one embodiment, the patterned second OPL portions 42' are removed by an aqueous based solution. The patterned OPL portions 34' remain on the semiconductor fins 20n in the nFinFET region and act as an implantation mask to shield the semiconductor fins 20n from the subsequent ion implantation.

Source/drain regions can be formed in the semiconductor fins 20p in the pFinFFT and in the semiconductor fins 20n in the nFinFET by the processing steps described above with respect to the first exemplary semiconductor structure illustrated in FIGS. 7A and 7B and will not be described again in detail.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:

forming a plurality of semiconductor fins on a substrate;

forming a gate structure over a portion of each semiconductor fin;

forming an organic planarization layer (OPL) over the substrate to cover the plurality of semiconductor fins and the gate structure;

recessing the OPL to expose a portion of the gate structure, wherein remaining portions of the OPL on opposite sides of the gate structure have uppermost surfaces located above top surfaces of the plurality of semiconductor fins, wherein the uppermost surfaces of the remaining portions of the OPL are located below an uppermost surface of the gate structure;

patterning the remaining portions of the OPL to expose portions of a first set of the plurality of semiconductor fins that are not covered by the gate structure and to leave a second set of the plurality of semiconductor fins covered; and implanting a first type dopant into portions of the exposed portions of the first set of the plurality of semiconductor fins on opposite sides of the gate structure to form source and drain regions in the first set of the plurality of semiconductor fins.

2. The method of claim 1, wherein the first set of the plurality of semiconductor fins is p-type semiconductor fins, and wherein the second set of the plurality of semiconductor fins is n-type semiconductor fins.

3. The method of claim 1, wherein the first type dopant is a p-type dopant comprising boron (B), indium (In), or gallium (B).

4. The method of claim 1, wherein the OPL comprises polyacrylate resin, epoxy resin, phenol resin, polyamide resin, polyimide resin, unsaturated polyester resin, polyphenylenether resin, polyphenylene sulfide resin, or benzocyclobutene (BCB).

5. The method of claim 1, wherein the OPL is recessed to a depth such that the remaining portions of the OPL do not shadow the implanting the first type dopant into the portions of the exposed portions of the first set of the plurality of semiconductor fins.

6. The method of claim 5, wherein the uppermost surfaces of the remaining portions of the OPL locate 40 nm to 60 nm above the top surfaces of the plurality of semiconductor fins.

7. The method of claim 1, wherein the uppermost surfaces of the remaining portions of the OPL are $C_xF_y$-containing surfaces.

8. The method of claim 1, further comprising removing patterned OPL portions that are formed after the patterning the remaining portions of the OPL from the second set of the plurality of semiconductor fins after the forming the source and drain regions in the first set of the plurality of semiconductor fins.

9. The method of claim 8, further comprising forming source and drain regions in the second set of the plurality of semiconductor fins after the removing the patterned OPL portions from the second set of the plurality of semiconductor fins, wherein the forming the source and drain regions in the second set of the plurality of semiconductor fins comprises:
  forming another organic planarization layer (OPL) over the substrate to cover the plurality of the semiconductor fins and the gate structure;
  recessing the another OPL to expose a portion of the gate structure, wherein remaining portions of the another OPL on opposite sides of the gate structure have uppermost surfaces located above the top surfaces of the plurality of semiconductor fins;
  patterning the remaining portions of the another OPL to expose portions of the second set of the plurality of semiconductor fins that are not covered by the gate structure and to leave the first set of the plurality of semiconductor fins covered; and
  implanting a second type dopant into portions of the exposed portions of the second set of the plurality of semiconductor fins on opposite sides of the gate structure,
  wherein the second type dopant has a polarity opposite to the first type dopant.

10. The method of claim 9, wherein the second type dopant is an n-type dopant comprising arsenic (As) or phosphorus (P).

11. The method of claim 1, wherein the gate structure comprises a gate dielectric located on a top surface and sidewalls of each of the plurality of semiconductor fins, a gate conductor located on the gate dielectric and a dielectric cap located on the gate conductor, where the uppermost surfaces of the remaining portions of the OPL are located below an upper surface of the dielectric cap.

12. The method of claim 11, wherein the forming the gate structure comprises:
  forming a material stack comprising a gate dielectric layer, a gate conductor layer and a dielectric cap layer over the plurality of semiconductor fins and the substrate; and
  patterning the material stack by lithographic and etching processes.

13. The method of claim 12, further comprising forming a dielectric spacer on each sidewall of the gate structure.

14. The method of claim 13, wherein the forming the dielectric spacer comprises:
  forming a spacer material layer on exposed surfaces of the gate structure, the plurality of semiconductor fins and the substrate; and
  etching the spacer material layer.

15. The method of claim 7, wherein each of the $C_xF_y$-containing surfaces has a thickness ranging. from 2 nm to 20 nm.

16. The method of claim 1, wherein the implanting the first type dopant is performed by an angled ion implantation process.

17. The method of claim 16, wherein the implanting the first type dopant is performed at an angle from 15° to 50°.

* * * * *